(12) United States Patent
Pal et al.

(10) Patent No.: US 9,564,877 B2
(45) Date of Patent: Feb. 7, 2017

(54) RESET SCHEME FOR SCAN CHAINS WITH ASYNCHRONOUS RESET SIGNALS

(71) Applicant: QUALCOMM Incorporated, San Diego, CA (US)

(72) Inventors: Dipti Ranjan Pal, San Diego, CA (US); Paul Ivan Penzes, Irvine, CA (US); Wai Kit Siu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 113 days.

(21) Appl. No.: 14/251,297

(22) Filed: Apr. 11, 2014

(65) Prior Publication Data
US 2015/0295560 A1 Oct. 15, 2015

(51) Int. Cl.
| | | |
|---|---|---|
| G01R 31/28 | (2006.01) | |
| H03K 3/012 | (2006.01) | |
| H03K 3/037 | (2006.01) | |
| G11C 19/34 | (2006.01) | |
| G01R 31/3185 | (2006.01) | |

(52) U.S. Cl.
CPC ....... *H03K 3/012* (2013.01); *G01R 31/318536* (2013.01); *G01R 31/318541* (2013.01); *G11C 19/34* (2013.01); *H03K 3/0375* (2013.01); *G01R 31/318594* (2013.01)

(58) Field of Classification Search
CPC ........ H03K 3/012; H03K 3/0375; G11C 19/34
See application file for complete search history.

(56) References Cited

U.S. PATENT DOCUMENTS

| | | | |
|---|---|---|---|
| 5,754,455 A | 5/1998 | Baker et al. | |
| 5,793,315 A | 8/1998 | Baker | |
| 5,881,067 A | 3/1999 | Narayanan et al. | |
| 6,393,592 B1 * | 5/2002 | Peeters | G01R 31/318541 |
| | | | 714/727 |
| 7,082,559 B2 | 7/2006 | Nozuyama | |
| 2007/0220453 A1 | 9/2007 | Tobita | |
| 2008/0155365 A1 * | 6/2008 | Casarsa | G01R 31/318541 |
| | | | 714/729 |

(Continued)

FOREIGN PATENT DOCUMENTS

| | | |
|---|---|---|
| CN | 102340304 A | 2/2012 |
| CN | 102495356 A | 6/2012 |

(Continued)

OTHER PUBLICATIONS

International Search Report and Written Opinion—PCT/US2015/020036—ISA/EPO—May 28, 2015.

*Primary Examiner* — Sam Rizk
(74) *Attorney, Agent, or Firm* — Arent Fox LLP (57) ABSTRACT

A first apparatus includes at least one scan chain. Each of the at least one scan chain includes scan cells coupled together. Each scan cell in the at least one scan chain includes a first type of scan cell when a reset state of the scan cell is a first state, and a second type of scan cell when the reset state of the scan cell is a second state. One or more scan chains of the at least one scan chain includes at least one of the first type of scan cell and at least one of the second type of scan cell. A second apparatus includes first and second sets of scan chains including flip-flops without both set and reset functionality. Each of the flip-flops in the first and second sets of scan chains has a reset state of a first state and a second state, respectively.

17 Claims, 10 Drawing Sheets

(56) References Cited

U.S. PATENT DOCUMENTS

2013/0132756 A1* 5/2013 Priel .................... G06F 1/3203
                                                                            713/324

FOREIGN PATENT DOCUMENTS

| CN | 102970013 A | 3/2013 |
|----|-------------|--------|
| CN | 103023467 A | 4/2013 |
| EP | 1939641 A1 | 7/2008 |

* cited by examiner

RESET SCHEME FOR SCAN CHAINS WITH ASYNCHRONOUS RESET SIGNALS

BACKGROUND

Field

The present disclosure relates generally to scan chains, and more particularly, to an asynchronous reset scheme for scan chains with asynchronous reset signals.

Background

To support a universal asynchronous reset (UAR) methodology, set/reset flip-flops are used in scan chains within a memory in a system on chip (SoC). In some implementations, set/reset flip-flops are 10% larger than non-set/non-reset flip-flops. The larger flip-flops affect the area, power consumption, and speed of operation of the SoC. Accordingly, apparatuses and methods are needed for using non-set/non-reset flip-flops in scan chains in association with asynchronous resets of the scan chains.

SUMMARY

In an aspect of the disclosure, an apparatus includes at least one scan chain. Each of the at least one scan chain includes a plurality of scan cells coupled together. Each scan cell in the at least one scan chain includes a first type of scan cell when a reset state of the scan cell is a first state, and a second type of scan cell different than the first type of scan cell when the reset state of the scan cell is a second state. One or more scan chains of the at least one scan chain includes at least one of the first type of scan cell and at least one of the second type of scan cell.

In an aspect of the disclosure, an apparatus includes a first set of scan chains and a second set of scan chains. Each of the first and second sets of scan chains includes flip-flops without both set and reset functionality. The apparatus further includes a reset module configured to clock a first state into each flip-flop in the first set of scan chains and to clock a second state different than the first state into each flip-flop in the second set of scan chains.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Traditionally, flip-flops have a set pin, a reset pin, or both set and reset pins. Enabling the set pin forces the flip-flop to store a 1. Enabling the reset pin forces the flip-flop to store a 0. Flip-flops having the ability to be set or reset by a set or reset signal include circuitry that performs the set or reset.

The exemplary methods/apparatuses use a different approach to force the output of a flip-flop to a desired state. Rather than setting or resetting all flip-flops using a set or reset pin upon a reset, a desired state is clocked into the flip-flops using a scan chain, and subsequently, the inverse state is set or reset (using the built-in set/reset circuitry) into the flip-flops that are required to store the inverse state upon the reset. Flip-flops that are supposed to be reset to the desired state are designed/constructed/manufactured to be non-set/non-reset flip-flops, and flip-flops that are supposed to be reset to store the inverse state are designed/constructed/manufactured to be reset type flip-flops (with built-in reset functionality) or set type flip-flops (with built-in set functionality). Set type flip-flops have built-in set functionality/circuitry for setting a 1 state into the flip-flop, and reset type flip-flops have built-in reset functionality/circuitry for resetting the state of the flip-flop to a 0. Non-set/non-reset flip-flops do not have such built-in set/reset functionality, and must be reset to a particular state by clocking the particular state into the flip-flop so that the state is stored in the flip-flop. Flip-flops without the set/reset functionality consume less area and power than traditional flip-flops having a set function, reset function, or both.

Figure 1:
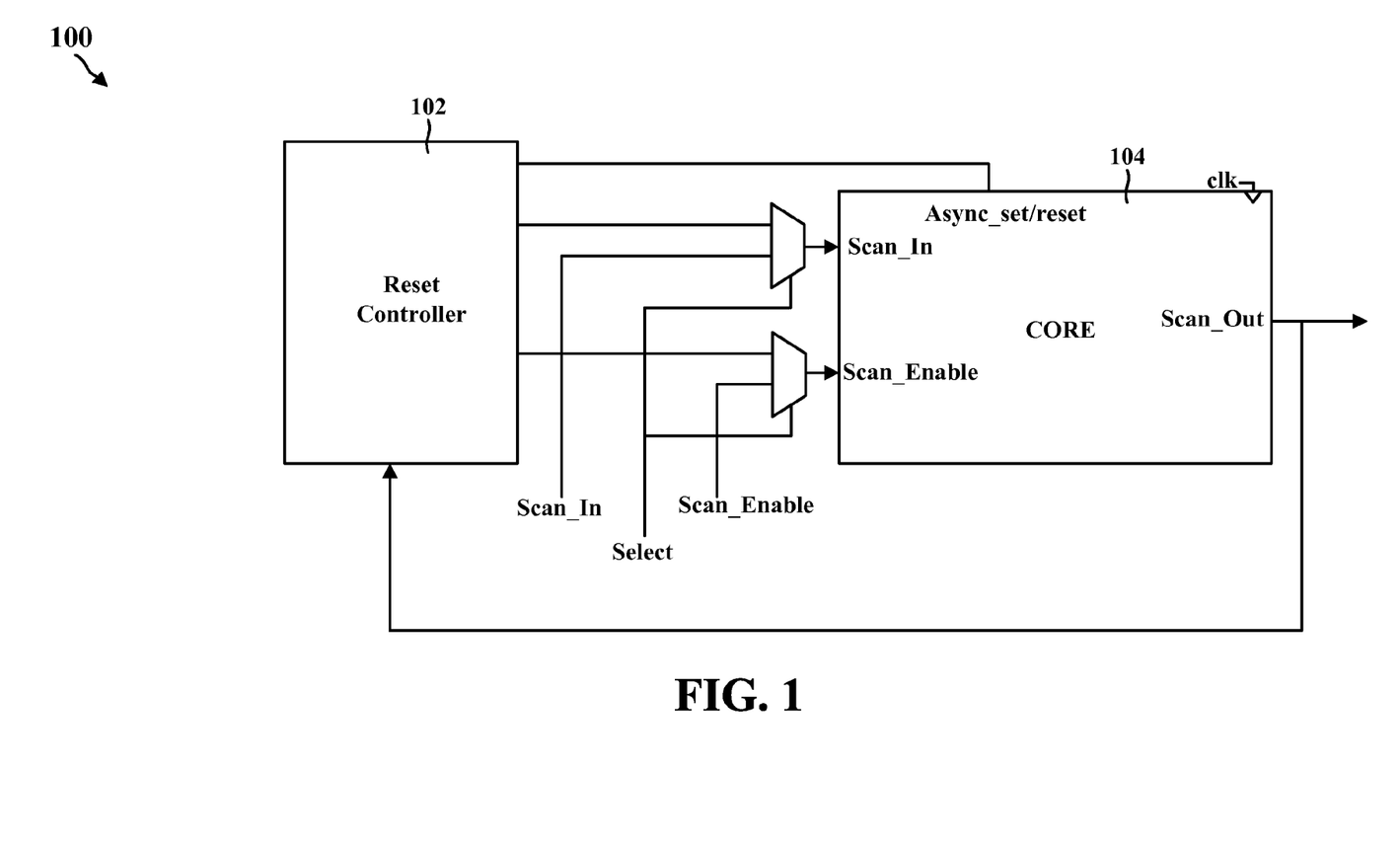
FIG. 1 is a diagram illustrating an exemplary reset controller and a memory/core.
Figure 2:
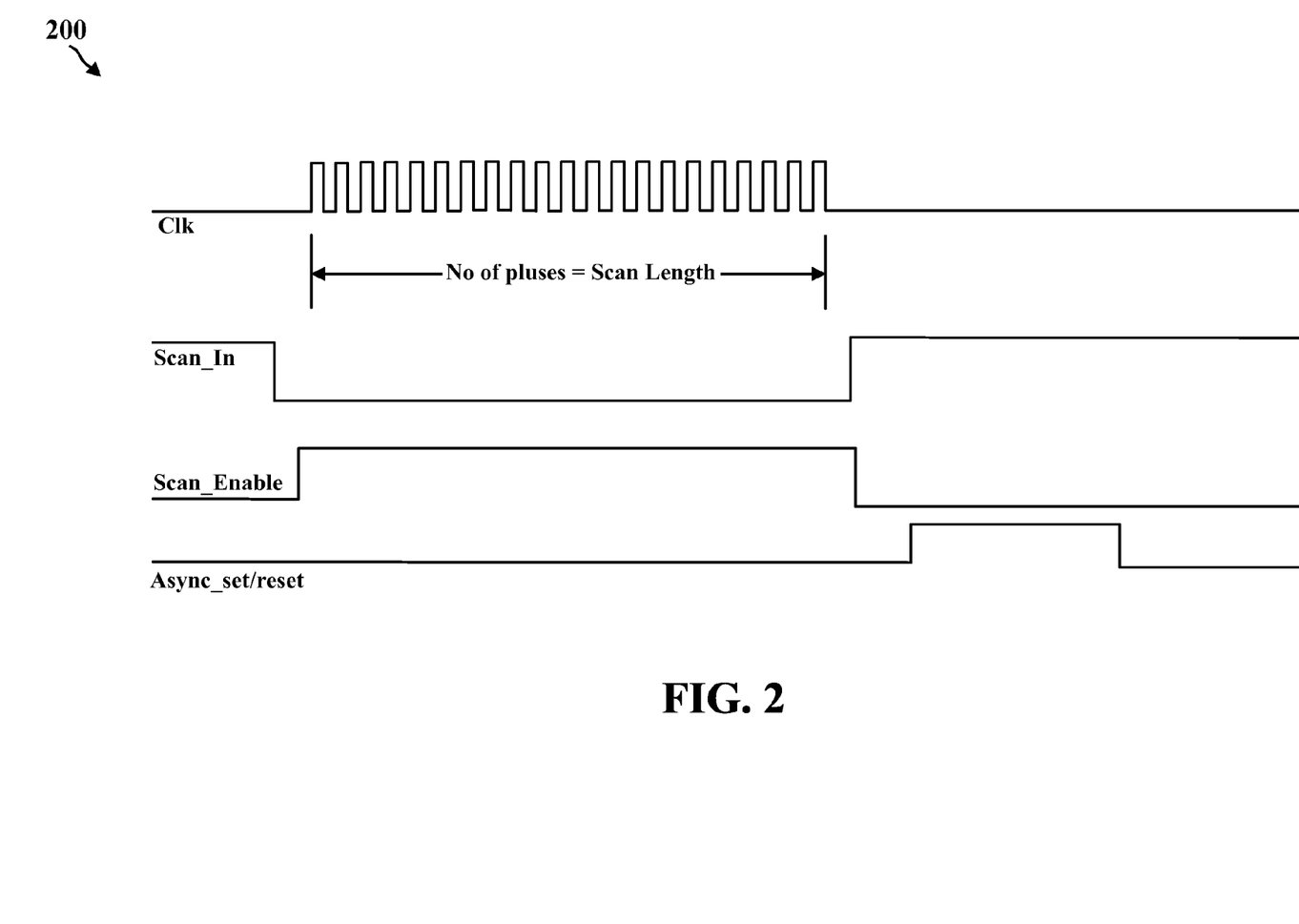
FIG. 2 is an exemplary timing diagram associated with the reset controller and the memory/core.

FIG. 1 is a diagram 100 illustrating an exemplary reset controller 102 and a memory/core 104. FIG. 2 is an exemplary timing diagram 200 associated with the reset controller 102 and the memory/core 104. The reset controller 102 (also referred to as a reset module) is configured to reset scan chains in the memory/core 104 upon a power on reset (POR) when being powered on, a watchdog reset in which a reset is due to the expiration of a watch dog timer (e.g., due to a software issue), a soft reset by software due to a software issue or a need to re-initialize the system after a particular operation, or a wake up reset after a power down of one or more modules. The reset controller 102 controls the scan_enable, the scan_in, and the clock during a reset phase of the memory/core 104. As shown in FIG. 2, the reset controller 102 sets the state of the scan_in to a high state or a low state (shown in FIG. 2 as a low state) and enables the scan_enable. In one configuration, the controller then clocks/shifts the state at the scan_in through all of the scan cells within the memory/core 104. In addition, if particular scan cells need to be reset/set to an opposite state than the state clocked/shifted through the scan cells, the reset controller 102 enables the async_set/reset and sets/resets the particular scan cells within the memory/core 104 that need to be reset/set.

Figure 3:
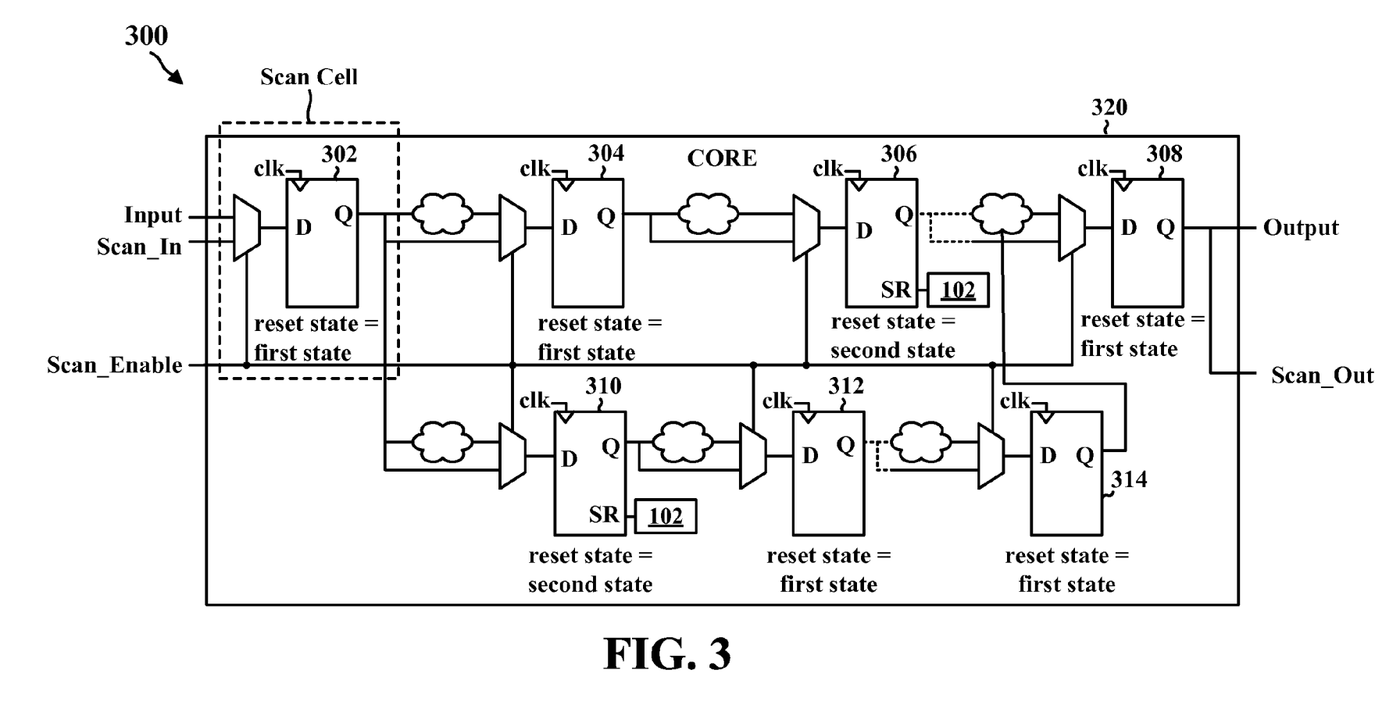
FIG. 3 is a first diagram illustrating a first exemplary apparatus and method associated with an asynchronous reset scheme for scan chains.

FIG. 3 is a first diagram 300 illustrating a first exemplary apparatus and method associated with an asynchronous reset scheme for scan chains. As shown in FIG. 3, the memory/core 320 includes a scan chain. The scan chain includes a plurality of scan cells coupled together. Each scan cell includes a multiplexer and a flip-flop. Flip-flops that need to be reset to a first state s are configured (e.g., designed and manufactured/constructed) to be non-set/non-reset flip-flops and flip-flops that need to be reset to a second state $\bar{s}$ are configured (e.g., designed and manufactured/constructed) to be set/reset flip-flops. For example, the flip-flops 302, 304, 308, 312, and 314 need to be reset to a first state s and are therefore non-set/non-reset flip-flops. The flip-flops 306 and 310 need to be reset to a second state and are therefore set/reset flip-flops.

When the first state is a 0 (s=0) and the second state is a 1 ($\bar{s}$=1), flip-flops that need to be reset to a 0 are configured to be non-set/non-reset flip-flops, and flip-flops that need to be reset to a 1 are configured to be set/reset flip-flops. The reset controller 102 inputs a 0 at the scan_in, enables the scan_enable to select the scan_in input at the multiplexer, and clocks/shifts a 0 through each of the flip-flops 302-314 until a 0 is stored in each of the flip-flops 302-314. Subsequently, the reset controller 102 sets a 1 into the flip-flops 306 and 310 (at a set pin labeled as "SR" using the built-in set functionality/circuitry in the flip-flop). When the first state is a 1 (s=1) and the second state is a ($\bar{s}$=0), flip-flops that need to be reset to a 1 are configured to be non-set/non-reset flip-flops, and flip-flops that need to be reset to a 0 are configured to be set/reset flip-flops. The reset controller 102 inputs a 1 at the scan_in, enables the scan_enable to select the scan_in input at the multiplexer, and clocks/shifts a 1 through each of the flip-flops 302-314 until a 1 is stored in each of the flip-flops 302-314. Subsequently, the reset controller 102 resets the flip-flops 306 and 310 to store a 0 (at a reset pin labeled as "SR" using the built-in reset functionality/circuitry in the flip-flop).

Referring again to FIG. 3, an apparatus (e.g., a memory) includes at least one scan chain. Each of the at least one scan chain includes a plurality of scan cells coupled together. Each scan cell in the at least one scan chain includes a first type of scan cell when a reset state of the scan cell is a first state s, and a second type of scan cell different than the first type of scan cell when the reset state of the scan cell is a second state $\bar{s}$. One or more scan chains of the at least one scan chain includes at least one of the first type of scan cell and at least one of the second type of scan cell. In one configuration, the first type of scan cell includes a multiplexer coupled to a first-type flip-flop without both set and reset functionality (e.g., the flip-flops 302, 304, 308, 312, and 314) (i.e., the first-type flip-flop does not contain set functionality and does not contain reset functionality), and the second type of scan cell includes a multiplexer coupled to a second-type flip-flop with at least one of set or reset functionality (e.g., the flip-flops 306 and 310).

In one configuration, the first state is a 0 (s=0) and the second state is a 1 ($\bar{s}$=1), and the second-type flip-flop includes set functionality. In such a configuration, to asynchronously reset the at least one scan chain, the reset controller 102 is configured to input the first state 0 into each of the at least one scan chain; to start a clock to clock the first state 0 through the scan cells until each flip-flop (including both first-type flip-flops and second-type flip-flops) in the at least one scan chain stores the first state 0; to stop the clock; and to set, subsequent to stopping the clock, the second state 1 into each of the second-type flip-flops within the at least one scan chain. Inputting the first state 0 into each of the at least one scan chain is a serial process. Setting the second state 1 into each of the second-type flip-flops within the at least one scan chain is a parallel process. As such, the at least one scan chain is reset asynchronously by storing the first state in a serially process in both the first-type flip-flops and the second-type flip-flops, and subsequently, storing (through a set) the second state in a parallel process in the second-type flip-flops.

In one configuration, the first state is a 1 (s=1) and the second state is a 0 ($\bar{s}$=0), and the second-type flip-flop includes reset functionality. In such a configuration, to asynchronously reset the at least one scan chain, the reset controller 102 is configured to input the first state 1 into each of the at least one scan chain; to start a clock to clock the first state 1 through the scan cells until each flip-flop (including both first-type flip-flops and second-type flip-flops) in the at least one scan chain stores the first state 1; to stop the clock; and to reset, subsequent to stopping the clock, each of the second-type flip-flops within the at least one scan chain to store the second state 0. Inputting the first state 1 into each of the at least one scan chain is a serial process. Resetting the second-type flip-flops within the at least one scan chain to store the second state 0 is a parallel process. As such, the at least one scan chain is reset asynchronously by storing the first state in a serially process in both the first-type flip-flops and the second-type flip-flops, and subsequently, storing (through a reset) the second state in a parallel process in the second-type flip-flops.

Figure 4:
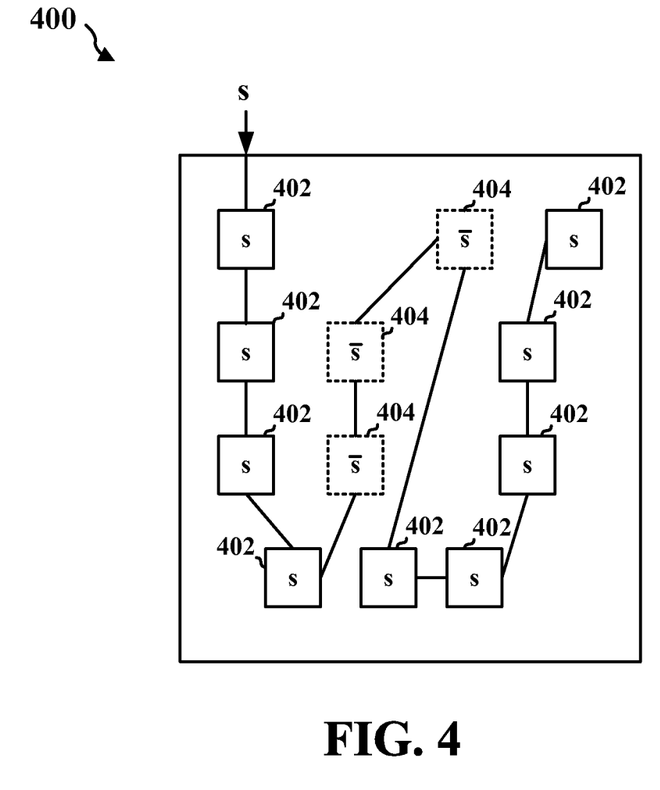
FIG. 4 is a second diagram illustrating the first exemplary apparatus and method associated with an asynchronous reset scheme for scan chains.

FIG. 4 is a second diagram 400 illustrating the first exemplary apparatus and method associated with an asynchronous reset scheme for scan chains. Referring to FIG. 4, a scan chain includes scan cells coupled together. Some of the scan cells include flip-flops 402 without reset/set functionality, and some of the scan cells include flip-flops 404 with reset/set functionality. The scan cells that need to be reset to the state s are configured to include non-reset/non-set flip-flops 402 and the scan cells that need to be reset to the state $\bar{s}$ are configured to include reset/set flip-flops 404. In such a configuration, the state s is clocked into each of the flip-flops 402 and 404, and the flip-flops 404 are subsequently reset/set to store the state $\bar{s}$. If the state s=0, then the flip-flops 404 are set to store a 1. If the state s=1, then the flip-flops 404 are reset to store a 0. In the first exemplary apparatus and method, all flip-flops that are reset to store the state s are designed and manufactured to be non-reset/non-set flip-flops, and all flip-flops that are reset to store the state $\bar{s}$ are designed and manufactured to be reset/set flip-flops.

In the first exemplary apparatus and method, use of the non-reset/non-set flip-flops in a scan chain requires a longer reset period for clocking a particular state through each of the flip-flops in the scan chain (if only reset/set flip-flops are used, they all may be reset/set at the same time). However, because the non-reset/non-set flip-flops are 10% smaller than reset/set flip-flops, use less power than reset/set flip-flops, and are faster than reset/set flip-flops, the first exemplary apparatus and method reduces an area, power consumption, and speed of operation of the scan cells by utilizing non-reset/non-set flip-flops in some of the scan cells. Further, non-reset/non-set flip-flops are less susceptible than set/reset flip-flops during near threshold computing (NTC) operation. Use of the non-reset/non-set flip-flops would therefore allow the use of a lower operating voltage during NTC operation than may be used when using reset/set flip-flops during NTC operation. In addition, use of non-reset/non-set flip-flops may save routing overhead for the reset/set pins. Lastly, no reset control is required during a design for test (DFT) (also known as design for testability) when using non-reset/non-set flip-flops.

Figure 5:
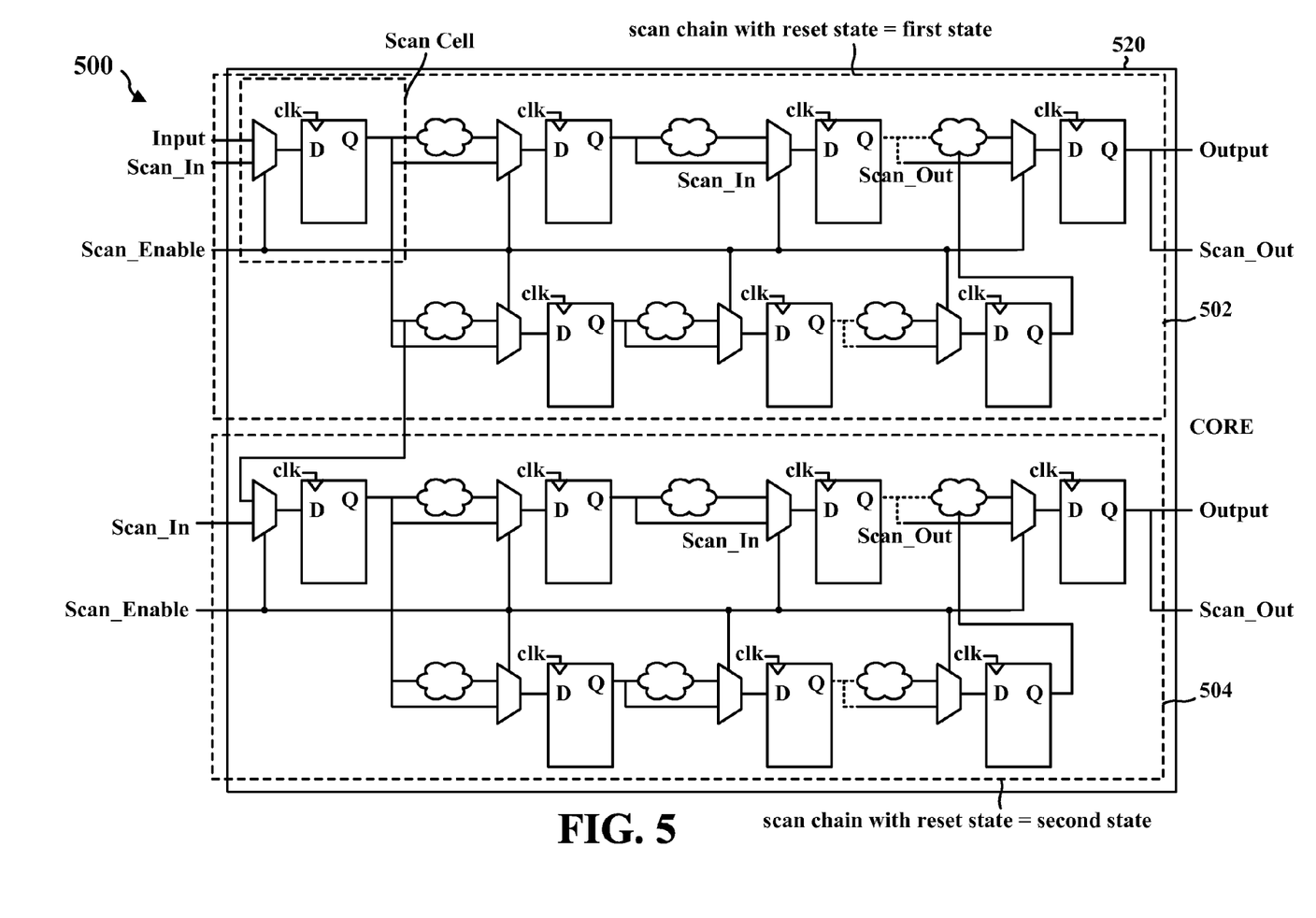
FIG. 5 is a first diagram illustrating a second exemplary apparatus and method associated with an asynchronous reset scheme for scan chains.

FIG. 5 is a first diagram 500 illustrating a second exemplary apparatus and method associated with an asynchronous reset scheme for scan chains. As shown in FIG. 5, the memory/core 520 includes two scan chains 502 and 504. A first scan chain 502 has a reset state of a first state s and a second scan chain 504 has a reset state of a second state $\bar{s}$. In the second exemplary apparatus and method, scan cells that have a reset state of a first state s are linked together (e.g., in the design and manufacturing process) into one or more scan chains, and scan cells that have a reset state of a second state $\bar{s}$ are linked together (e.g., in the design and manufacturing process) into one or more scan chains. Further, all flip-flops may be configured to be non-reset/non-set flip-flops. On a reset, the reset controller 102 may then shift/clock the first state s through the scan chains that have a reset state of a first state s and shift/clock the second state $\bar{s}$ through the scan chains that have a reset state of a second state $\bar{s}$.

Referring again to FIG. 5, an apparatus includes a first set of scan chains 502 including flip-flops without both set and reset functionality. Each of the flip-flops in the first set of scan chains 502 has a reset state of a first state s. The apparatus includes a second set of scan chains 504 including flip-flops without both set and reset functionality. Each of the flip-flops in the second set of scan chains 504 has the reset state of a second state $\bar{s}$ different than the first state s. A reset module (e.g., the reset controller 102) is configured to clock a first state s into each flip-flop in the first set of scan chains and to clock a second state $\bar{e}$ different than the first state s into each flip-flop in the second set of scan chains. The reset module is configured to asynchronously reset the first set of scan chains 502 by inputting the first state s into each scan chain (at the scan-in) in the first set of scan chains 502 and clocking the first state s through the flip-flops until each flip-flop in the first set of scan chains 502 stores the first state s. The reset module is configured to asynchronously reset the second set of scan chains 504 by inputting the second state $\bar{s}$ into each scan chain (at the scan_in) in the second set of scan chains 504 and clocking the second state $\bar{s}$ through the flip-flops until each flip-flop in the second set of scan chains 504 stores the second state $\bar{s}$. In one configuration, the first and second states s, $\bar{s}$ are 0 and 1, respectively. In another configuration, the first and second states s, $\bar{s}$ are 1 and 0, respectively.

Figure 6:
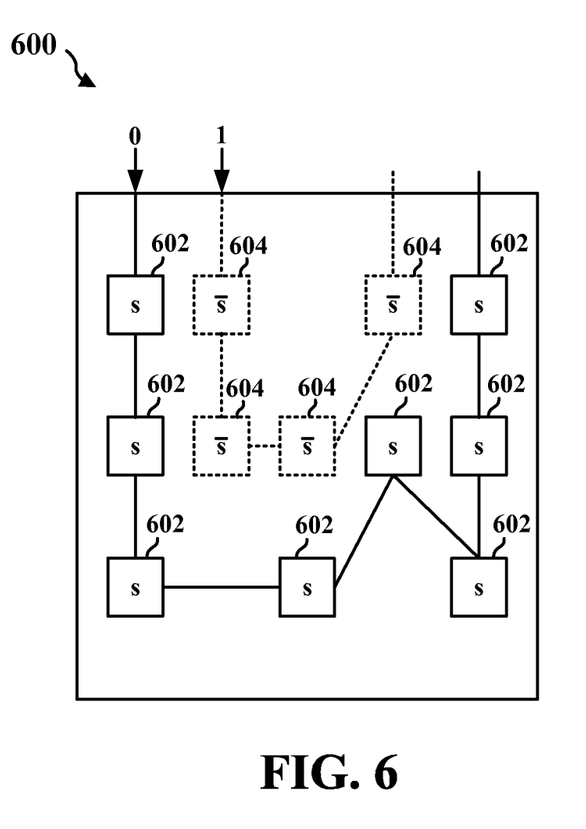
FIG. 6 is a second diagram illustrating the second exemplary apparatus and method associated with an asynchronous reset scheme for scan chains.

FIG. 6 is a second diagram 600 illustrating the second exemplary apparatus and method associated with an asynchronous reset scheme for scan chains. Referring to FIG. 6, scan cells 602 that need to be reset to the state s are configured to be linked together into one or more scan chains and the scan cells 604 that need to be reset to the state $\bar{s}$ are configured to be linked together into one or more scan chains. The scan cells 602, 604 all include non-reset/non-set flip-flops. Accordingly, in the second exemplary apparatus and method, all flip-flops in a set of scan chains are designed and manufactured to be non-reset/non-set flip-flops.

In the second exemplary apparatus and method, use of the non-reset/non-set flip-flops in a scan chain requires a longer reset period for clocking a particular state through each of the flip-flops in the scan chain. However, because the non-reset/non-set flip-flops are 10% smaller than reset/set flip-flops, use less power than reset/set flip-flops, and are faster than reset/set flip-flops, the second exemplary apparatus and method reduces an area, power consumption, and speed of operation of the scan cells by utilizing non-reset/non-set flip-flops in all of the scan cells of a set of scan chains (which may or may not include all of the scan chains within the apparatus). Further, non-reset/non-set flip-flops are less susceptible than set/reset flip-flops during NTC operation. Use of the non-reset/non-set flip-flops would therefore allow the use of a lower operating voltage during NTC operation than may be used when using reset/set flip-flops during NTC operation. In addition, use of non-reset/non-set flip-flops may save routing overhead for the reset/set pins. Lastly, no reset control is required during a DFT when using non-reset/non-reset pins.

Figure 7:
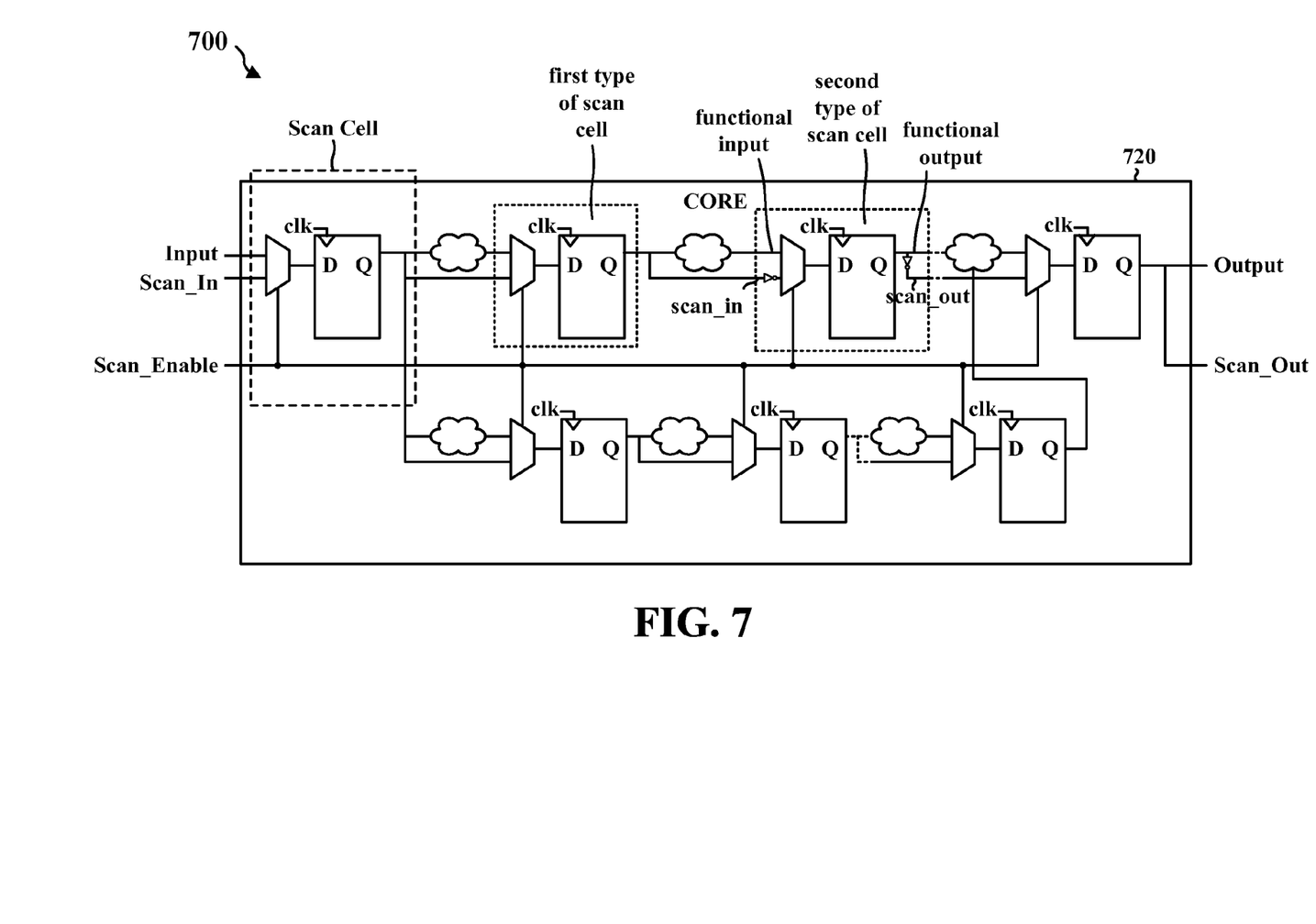
FIG. 7 is a first diagram illustrating a third exemplary apparatus and method associated with an asynchronous reset scheme for scan chains.

FIG. 7 is a first diagram 700 illustrating a third exemplary apparatus and method associated with an asynchronous reset scheme for scan chains. As shown in FIG. 7, the memory/core 720 includes a scan chain. The scan chain includes a plurality of scan cells coupled together. Each scan cell includes a multiplexer and a flip-flop. Scan cells that need to be reset to a first state s are configured (e.g., designed and manufactured/constructed) to be a first type of scan cell and scan cells that need to be reset to a second state $\bar{s}$ are configured (e.g., designed and manufactured/constructed) to be a second type of scan cell. The scan chain includes at least one of the first type of scan cell and at least one of the second type of scan cell. The first type of scan cell includes a multiplexer coupled to a non-reset/non-set flip-flop, and the second type of scan cell also includes a multiplexer coupled to a non-reset/non-set flip-flop. However, the second type of scan cell further includes a first inverter for inverting a scan_in signal input into the flip-flop, and a second inverter for inverting a scan_out signal output from the flip-flop. When the reset controller 102 shifts/clocks state s through a second type of scan cell, the first inverter inverts the state in the second type of scan cell so that the state $\bar{s}$ is shifted/clocked into the flip-flop in the second type of scan cell. The second inverter inverts the state $\bar{s}$ back to the state s so that the state s may be shifted/clocked to the remaining scan cells.

Referring again to FIG. 7, an apparatus includes at least one scan chain. Each of the at least one scan chain includes a plurality of scan cells coupled together. Each scan cell in the at least one scan chain includes a first type of scan cell when a reset state of the scan cell is a first state s, and a second type of scan cell different than the first type of scan cell when the reset state of the scan cell is a second state $\bar{s}$. One or more scan chains of the at least one scan chain includes at least one of the first type of scan cell and at least one of the second type of scan cell. In one configuration, the first type of scan cell includes a multiplexer coupled to a flip-flop without both set and reset functionality. The second type of scan cell includes a multiplexer having a functional input and a scan input (scan_in). The second type of scan cell further includes a flip-flop without both set and reset functionality coupled to the multiplexer. The flip-flop has a functional output and a scan output (scan_out). The second type of scan cell further includes a first inverter coupled to the scan input, and a second inverter coupled to the scan output. In one configuration, the first state s is a 0 and the second state $\bar{e}$ is a 1. In another configuration, the first state s is a 1 and the second state $\bar{e}$ is a 0.

Figure 8:
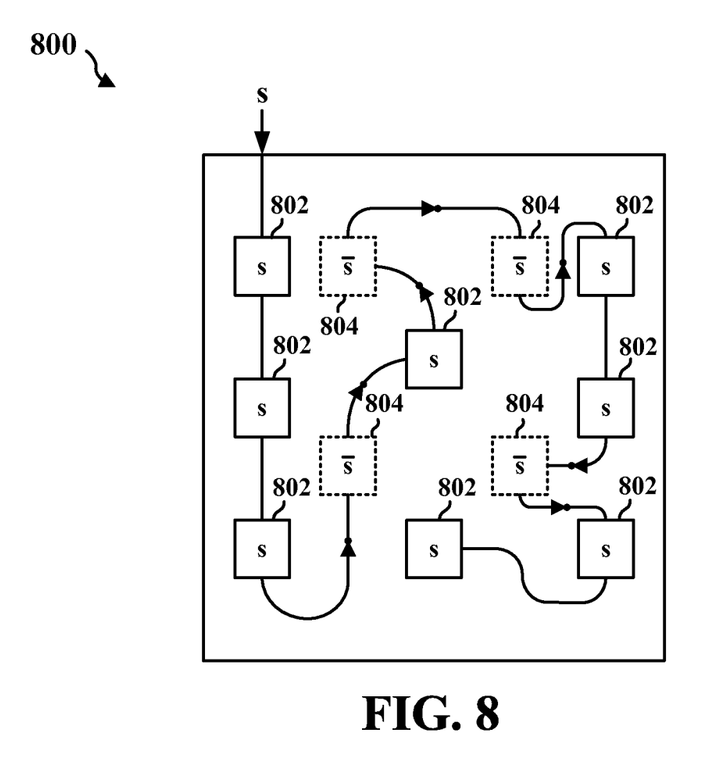
FIG. 8 is a second diagram illustrating the third exemplary apparatus and method associated with an asynchronous reset scheme for scan chains.

FIG. 8 is a second diagram 800 illustrating the third exemplary apparatus and method associated with an asynchronous reset scheme for scan chains. Referring to FIG. 8, a scan chain includes scan cells coupled together. The scan cells that need to be reset to the state s are configured to be a first type of scan cell and the scan cells that need to be reset to the state s̄ are configured to be a second type of scan cell. Both the first and second types of scan cells include non-reset/non-set flip-flops. However, the second type of scan cells further include inverters so that the state s̄ is input into the flip-flops 804 of the second type of scan cells and the state s̄ is inverted to state s for output to subsequent scan cells. In such a configuration, the state s is stored into each of the flip-flops 802 of the first type of scan cells, and the state s̄ is stored into each of the flip-flops 804 of the second type of scan cells.

In the third exemplary apparatus and method, all flip-flops are designed and manufactured to be non-reset/non-set flip-flops. The scan cells that need to be reset to the state s are designed and manufactured with non-reset/non-set flip-flops, and the scan cells that need to reset to the state s̄ are designed and manufactured with non-reset/non-set flip-flops and inverters for inverting the scan input/output. In the third exemplary apparatus and method, use of the non-reset/non-set flip-flops in a scan chain requires a longer reset period for clocking a particular state through each of the flip-flops in the scan chain. However, because the non-reset/non-set flip-flops are 10% smaller than reset/set flip-flops, use less power than reset/set flip-flops, and are faster than reset/set flip-flops, the third exemplary apparatus and method reduces an area, power consumption, and speed of operation of the scan cells by utilizing non-reset/non-set flip-flops in all of the scan cells of a set of scan chains (which may or may not include all of the scan chains within the apparatus). Further, non-reset/non-set flip-flops are less susceptible than set/reset flip-flops during NTC operation. Use of the non-reset/non-set flip-flops would therefore allow the use of a lower operating voltage during NTC operation than may be used when using reset/set flip-flops during NTC operation. In addition, use of non-reset/non-set flip-flops may save routing overhead for the reset/set pins. Lastly, no reset control is required during a DFT when using non-reset/non-reset pins.

Figure 9:
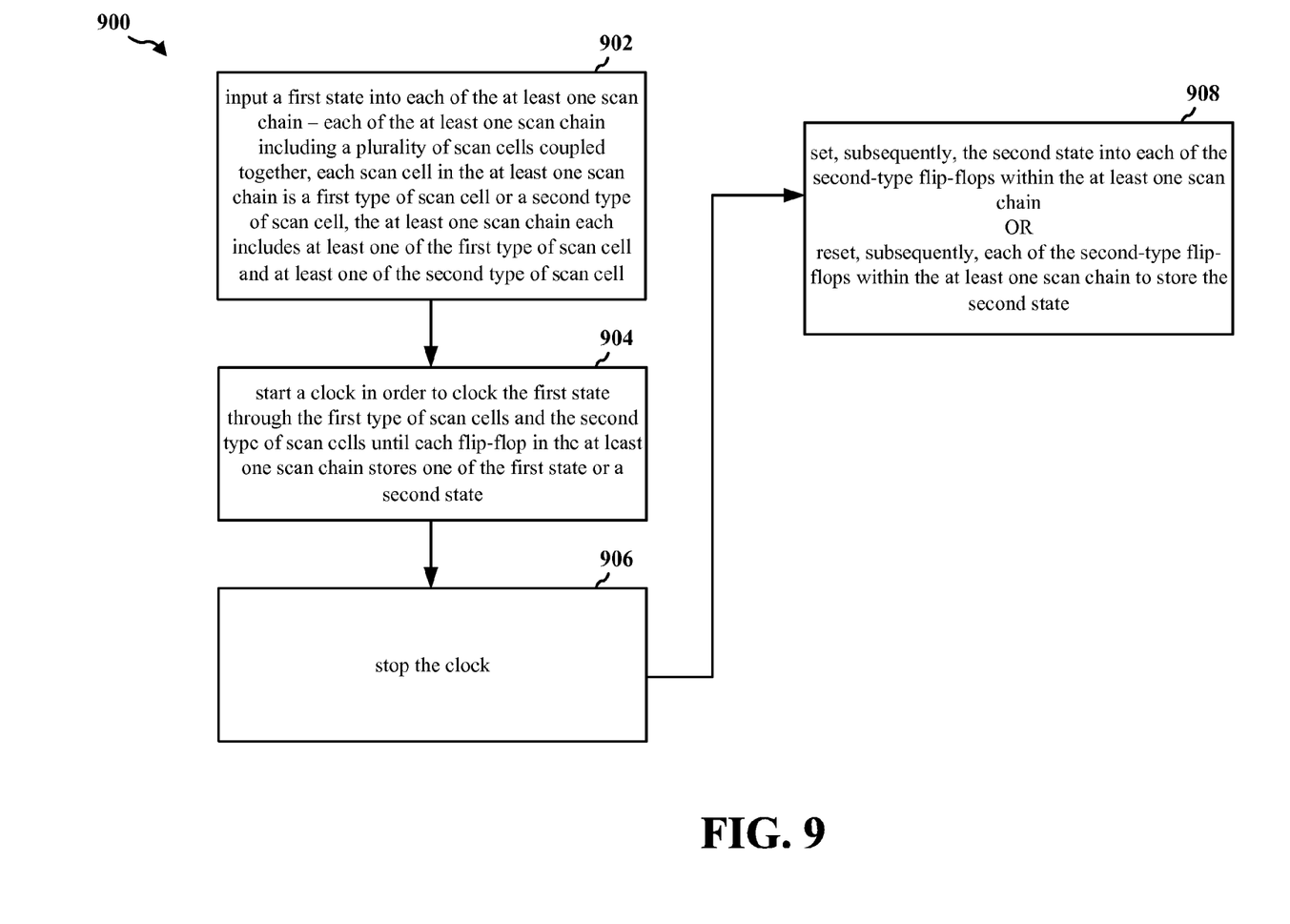
FIG. 9 is a diagram for illustrating first and third methods for performing an asynchronous reset in the first and third exemplary apparatuses, respectively.

FIG. 9 is a diagram 900 for illustrating first and third methods for performing an asynchronous reset in the first and third exemplary apparatuses, respectively. The apparatus includes at least one scan chain and a reset controller/module. In step 902, the reset controller/module inputs a first state into each of the at least one scan chain. Each of the at least one scan chain includes a plurality of scan cells coupled together. Each scan cell in the at least one scan chain is a first type of scan cell or a second type of scan cell. The at least one scan chain each includes at least one of the first type of scan cell and at least one of the second type of scan cell. In step 904, the reset controller/module starts a clock to clock the first state through the first type of scan cells and the second type of scan cells until each flip-flop in the at least one scan chain stores one of the first state or a second state. In step 906, the reset controller/module stops the clock. For this method, see also FIGS. 3, 4, 7, and 8.

Referring to FIGS. 3, 4, and 9, in one configuration, the first type of scan cell includes a multiplexer coupled to a first-type flip-flop without both set and reset functionality, and the second type of scan cell includes a multiplexer coupled to a second-type flip-flop with at least one of set or reset functionality. In one configuration, the clock is started to clock the first state through the scan cells until each flip-flop in the at least one scan chain stores the first state.

In one configuration, the first state is a 0 and the second state is a 1, the second-type flip-flop includes set functionality, and in step 908, the reset controller/module sets, subsequent to stopping the clock, the second state into each of the second-type flip-flops within the at least one scan chain. In one configuration, the first state is a 1 and the second state is a 0, the second-type flip-flop includes reset functionality, and the reset controller/module resets, subsequent to stopping the clock, each of the second-type flip-flops within the at least one scan chain to store the second state.

Referring to FIGS. 7, 8, and 9, in one configuration, the clock is started to clock the first state through the scan cells until each of the first type of scan cell stores the first state and each of the second type of scan cell stores a second state different than the first state. In such a configuration, the first type of scan cell includes a multiplexer coupled to a flip-flop without both set and reset functionality, and the second type of scan cell includes a multiplexer having a functional input and a scan input. The second type of scan cell further includes a flip-flop without both set and reset functionality coupled to the multiplexer. The flip-flop has a functional output and a scan output. The second type of scan cell further includes a first inverter coupled to the scan input for inverting the first state to the second state for input to the flip-flop. The second type of scan cell further includes a second inverter coupled to the scan output for inverting the second state to the first state on output from the flip-flop. In one configuration, the first state is a 0 and the second state is a 1. In another configuration, the first state is a 1 and the second state is a 0.

In one configuration, an apparatus for performing an asynchronous reset includes at least one scan chain. The apparatus includes means for inputting a first state into each of the at least one scan chain. Each of the at least one scan chain includes a plurality of scan cells coupled together. Each scan cell in the at least one scan chain is a first type of scan cell or a second type of scan cell. The at least one scan chain each includes at least one of the first type of scan cell and at least one of the second type of scan cell. The apparatus further includes means for starting a clock to clock the first state through the first type of scan cells and the second type of scan cells until each flip-flop in the at least one scan chain stores one of the first state or a second state. The apparatus further includes means for stopping the clock. The first type of scan cell may include a multiplexer coupled to a first-type flip-flop without both set and reset functionality, and the second type of scan cell may include a multiplexer coupled to a second-type flip-flop with at least one of set or reset functionality. The means for starting the clock may clock the first state through the scan cells until each flip-flop in the at least one scan chain stores the first state. In one configuration, the first state is a 0 and the second state is a 1, the second-type flip-flop includes set functionality, and the apparatus further includes means for setting, subsequent to stopping the clock, the second state into each of the second-type flip-flops within the at least one scan chain. In one configuration, the first state is a 1 and the second state is a 0, the second-type flip-flop includes reset functionality, and the apparatus further includes means for resetting, subsequent to stopping the clock, each of the second-type flip-flops within the at least one scan chain to store the second state. In one configuration, the means for starting the clock clocks the first state through the scan cells until each of the first type of scan cell stores the first state and each of the second type of scan cell stores a second state different than the first state. In such a configuration, the first type of scan cell includes a multiplexer coupled to a flip-flop without both set and reset functionality, and the second type of scan cell includes a multiplexer having a functional input and a scan input and a flip-flop without both set and reset functionality coupled to the multiplexer. The flip-flop has a functional output and a scan output. The second type of scan cell further includes a first inverter coupled to the scan input for inverting the first state to the second state for input to the flip-flop, and a second inverter coupled to the scan output for inverting the second state to the first state on output from the flip-flop. In one configuration, the first state is a 0 and the second state is a 1. In another configuration, the first state is a 1 and the second state is a 0.

Figure 10:
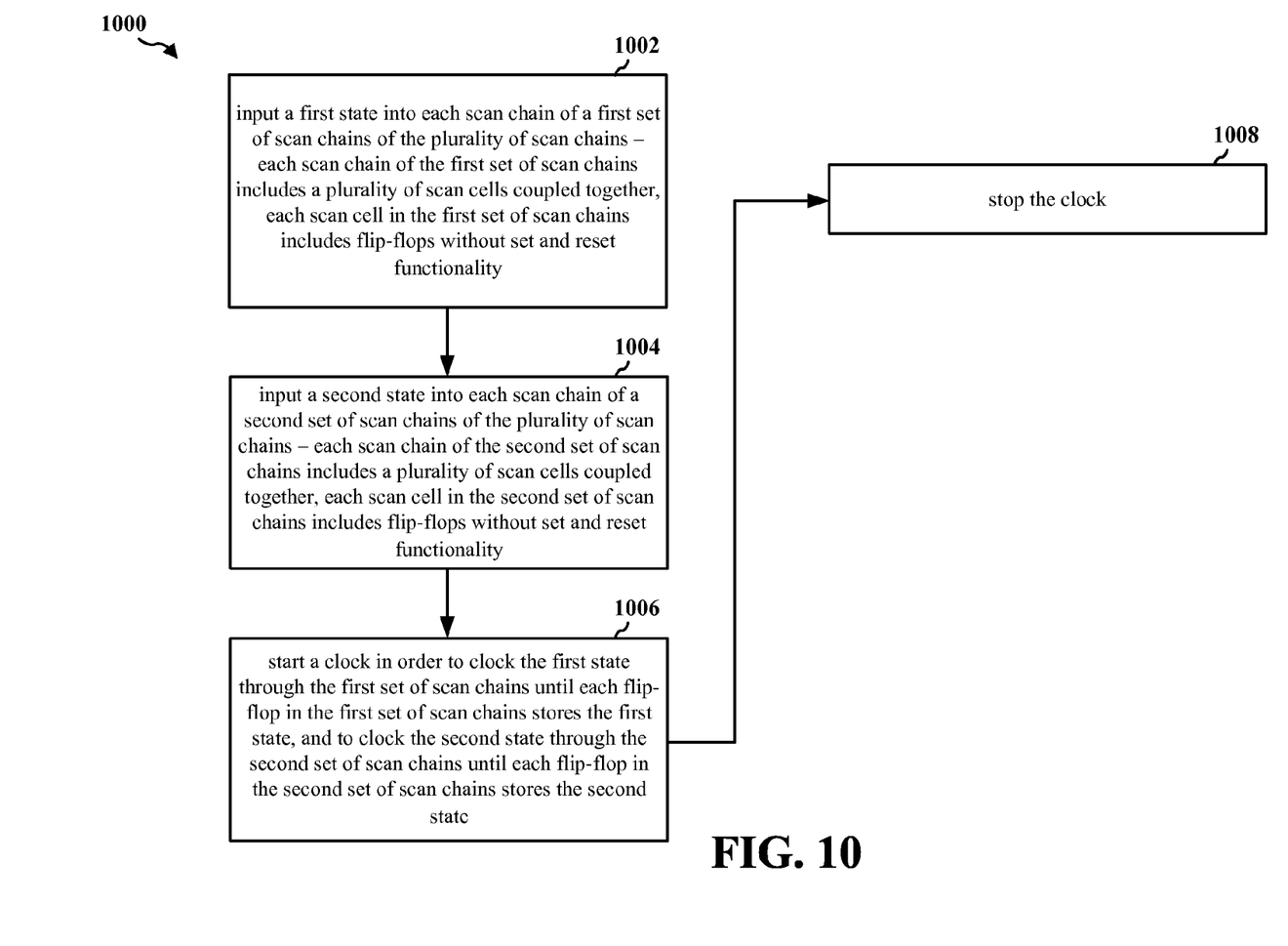
FIG. 10 is a diagram for illustrating a second method for performing an asynchronous reset in the second exemplary apparatus.

FIG. 10 is a diagram 1000 for illustrating a second method for performing an asynchronous reset in the second exemplary apparatus. The apparatus includes a plurality of scan chains and a reset controller/module. In step 1002, the reset controller/module inputs a first state into each scan chain of a first set of scan chains of the plurality of scan chains. Each scan chain of the first set of scan chains includes a plurality of scan cells coupled together. Each scan cell in the first set of scan chains includes flip-flops without both set and reset functionality. In step 1004, the reset controller/module inputs a second state into each scan chain of a second set of scan chains of the plurality of scan chains. Each scan chain of the second set of scan chains includes a plurality of scan cells coupled together. Each scan cell in the second set of scan chains includes flip-flops without both set and reset functionality. In step 1006, the reset controller/module starts a clock to clock the first state through the first set of scan chains until each flip-flop in the first set of scan chains stores the first state, and to clock the second state through the second set of scan chains until each flip-flop in the second set of scan chains stores the second state. In step 1008, the reset controller/module stops the clock. For this method, see also FIGS. 5 and 6.

In one configuration, an apparatus for performing an asynchronous reset includes a plurality of scan chains. The apparatus further includes means for inputting a first state into each scan chain of a first set of scan chains of the plurality of scan chains. Each scan chain of the first set of scan chains includes a plurality of scan cells coupled together. Each scan cell in the first set of scan chains includes flip-flops without both set and reset functionality. The apparatus further includes means for inputting a second state into each scan chain of a second set of scan chains of the plurality of scan chains. Each scan chain of the second set of scan chains includes a plurality of scan cells coupled together. Each scan cell in the second set of scan chains includes flip-flops without both set and reset functionality. The apparatus further includes means for starting a clock to clock the first state through the first set of scan chains until each flip-flop in the first set of scan chains stores the first state, and to clock the second state through the second set of scan chains until each flip-flop in the second set of scan chains stores the second state. The apparatus further includes means for stopping the clock.

First, second, and third apparatuses and methods associated with an asynchronous reset scheme for scan chains are provided supra. In the first exemplary apparatus and method (see FIGS. 3, 4, and 9), scan cells that need to be reset to a first state s are designed and manufactured to include non-set/non-reset flip-flops, and scan cells that need to be reset to a second state $\bar{s}$ are designed manufactured to include set/reset flip-flops. In the second exemplary apparatus and method (see FIGS. 5, 6, and 10), scan cells that need to be reset to a first state s are linked together within scan chains of a first set of scan chains, and scan cells that need to be reset to a second state $\bar{e}$ are linked together within scan chains of a second set of scan chains. The linking occurs during a design and manufacturing process of the first and second set of scan chains. In the third exemplary apparatus and method (see FIGS. 7, 8, and 9), scan cells that need to be reset to a first state s are designed and manufactured to include non-set/non-reset flip-flops, and scan cells that need to be reset to a second state $\bar{e}$ are designed and manufactured to include non-set/non-reset flip-flops and inverters for inverting a scan input and scan output.

As discussed supra, use of non-set/non-reset flip-flops rather than set/reset flip-flops within scan cells reduces an area, power consumption, and speed of operation of the scan cells during all phases of operation of the scan cells. Further, use of non-set/non-reset flip-flops rather than set/reset flip-flops within scan cells provides additional advantages, as non-reset/non-set flip-flops are less susceptible than set/reset flip-flops during NTC operation (which would allow the use of a lower operating voltage during NTC operation than may be used when using reset/set flip-flops during NTC operation), use of non-reset/non-set flip-flops may save routing overhead for the reset/set pins, and no reset control is required during a DFT when using non-reset/non-reset pins. The second exemplary apparatus and method may provide the most advantages because scan cells that include set/reset flip-flops may all be replaced with scan cells that include non-set/non-reset flip-flops. However, the second exemplary apparatus and method may not be available if it is not possible to design scan cells with a first reset state to be linked together in one or more sets of scan chains, and scan cells with a second reset state to be linked together in one or more different sets of scan chains. The third exemplary apparatus and method provide the next best advantage because scan cells that include set/reset flip-flops may all be replaced with scan cells that include non-set/non-reset flip-flops or scan cells that include both non-set/non-reset flip-flops and inverters. The inverters are not in the functional path, and therefore do not slow operation during normal operation in a functional phase. The first exemplary apparatus and method also provide an advantage, as all of the set/reset flip-flops that are reset to a first state may be replaced with non-set/non-reset flip-flops.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus comprising at least one scan chain, each of the at least one scan chain comprising a plurality of scan cells coupled together, wherein each scan cell in the at least one scan chain comprises:
   a first type of scan cell when a reset state of the scan cell is a first state, the first type of scan cell comprising a first-type flip-flop without both built-in set and reset circuitry; and
   a second type of scan cell different than the first type of scan cell when the reset state of the scan cell is a second state, the second type of scan cell comprising a second-type flip-flop with at least one of built-in set or reset circuitry,
   wherein one or more scan chains of the at least one scan chain comprises at least one of the first type of scan cell and at least one of the second type of scan cell, the one or more scan chains comprising scan cells in which each scan cell is one of the first type of scan cell or the second type of scan cell depending on whether the reset state of the scan cell is the first state or the second state, respectively.

2. The apparatus of claim 1, wherein the first type of scan cell further comprises a multiplexer coupled to the first-type flip-flop, and the second type of scan cell further comprises a multiplexer coupled to the second-type flip-flop.

3. The apparatus of claim 2, wherein the first state is a 0 and the second state is a 1, and the second-type flip-flop includes the built-in set circuitry.

4. The apparatus of claim 3, further comprising a reset module that is configured to asynchronously reset the at least one scan chain, wherein to asynchronously reset the at least one scan chain, the reset module is configured to:
   input the first state into each of the at least one scan chain;
   start a clock to clock the first state through the scan cells until each flip-flop in the at least one scan chain stores the first state;
   stop the clock; and
   set, subsequent to stopping the clock, the second state into each of the second-type flip-flops within the at least one scan chain.

5. The apparatus of claim 1, wherein the first state is a 1 and the second state is a 0, and the second-type flip-flop includes the built-in reset circuitry.

6. The apparatus of claim 5, further comprising a reset module that is configured to asynchronously reset the at least one scan chain, wherein to asynchronously reset the at least one scan chain, the reset module is configured to:
   input the first state into each of the at least one scan chain;
   start a clock to clock the first state through the scan cells until each flip-flop in the at least one scan chain stores the first state;
   stop the clock; and
   reset, subsequent to stopping the clock, each of the second-type flip-flops within the at least one scan chain to store the second state.

7. An apparatus comprising at least one scan chain, each of the at least one scan chain comprising a plurality of scan cells coupled together, wherein each scan cell in the at least one scan chain comprises:
   a first type of scan cell when a reset state of the scan cell is a first state, the first type of scan cell comprising a multiplexer coupled to a flip-flop without both built-in set and reset circuitry; and
   a second type of scan cell different than the first type of scan cell when the reset state of the scan cell is a second state, the second type of scan cell comprising:
      a multiplexer having a functional input and a scan input;
      a flip-flop without both built-in set and reset circuitry coupled to the multiplexer, the flip-flop having a functional output and a scan output;
      a first inverter coupled to the scan input; and
      a second inverter coupled to the scan output; and
   wherein one or more scan chains of the at least one scan chain comprises at least one of the first type of scan cell and at least one of the second type of scan cell, the one or more scan chains comprising scan cells in which each scan cell is one of the first type of scan cell or the second type of scan cell depending on whether the reset state of the scan cell is the first state or the second state, respectively.

8. The apparatus of claim 7, wherein the first state is a 0 and the second state is a 1.

9. The apparatus of claim 7, wherein the first state is a 1 and the second state is a 0.

10. A method for performing an asynchronous reset in an apparatus including at least one scan chain, the method comprising:
    inputting a first state into each of the at least one scan chain, each of the at least one scan chain comprising a plurality of scan cells coupled together, each scan cell in the at least one scan chain being a first type of scan cell or a second type of scan cell, the first type of scan cell comprising a first-type flip-flop without both built-in set and reset circuitry, the second type of scan cell comprising a second-type flip-flop with at least one of built-in set or reset circuitry, the at least one scan chain each including at least one of the first type of scan cell and at least one of the second type of scan cell, each of the at least one scan chain comprising scan cells in which each scan cell is one of the first type of scan cell or the second type of scan cell depending on whether the reset state of the scan cell is the first state or the second state, respectively;
    starting a clock to clock the first state through the first type of scan cells and the second type of scan cells until each flip-flop in the at least one scan chain stores one of the first state or a second state; and
    stopping the clock.

11. The method of claim 10, wherein the first type of scan cell further comprises a multiplexer coupled to the first-type flip-flop, and the second type of scan cell further comprises a multiplexer coupled to the second-type flip-flop.

12. The method of claim 11, wherein the clock is started to clock the first state through the scan cells until each flip-flop in the at least one scan chain stores the first state.

13. The method of claim 12, wherein the first state is a 0 and the second state is a 1, the second-type flip-flop includes the built-in set circuitry, and the method further comprises setting, subsequent to stopping the clock, the second state into each of the second-type flip-flops within the at least one scan chain.

14. The method of claim 12, wherein the first state is a 1 and the second state is a 0, the second-type flip-flop includes the built-in reset circuitry, and the method further comprises resetting, subsequent to stopping the clock, each of the second-type flip-flops within the at least one scan chain to store the second state.

15. A method for performing an asynchronous reset in an apparatus including at least one scan chain, the method comprising:
　inputting a first state into each of the at least one scan chain, each of the at least one scan chain comprising a plurality of scan cells coupled together, each scan cell in the at least one scan chain being a first type of scan cell or a second type of scan cell, the at least one scan chain each including at least one of the first type of scan cell and at least one of the second type of scan cell each of the at least one scan chain comprising scan cells in which each scan cell is one of the first type of scan cell or the second type of scan cell depending on whether the reset state of the scan cell is the first state or the second state, respectively;
　starting a clock to clock the first state through the first type of scan cells and the second type of scan cells until each flip-flop in the at least one scan chain stores one of the first state or a second state, wherein the clock is started to clock the first state through the scan cells until each of the first type of scan cell stores the first state and each of the second type of scan cell stores a the second state different than the first state, and wherein the first type of scan cell comprises a multiplexer coupled to a flip-flop without both built-in set and reset circuitry, and the second type of scan cell comprises:
　　a multiplexer having a functional input and a scan input;
　　a flip-flop without both built-in set and reset circuitry coupled to the multiplexer, the flip-flop having a functional output and a scan output;
　　a first inverter coupled to the scan input for inverting the first state to the second state for input to the flip-flop; and
　　a second inverter coupled to the scan output for inverting the second state to the first state on output from the flip-flop; and
　stopping the clock.

16. The method of claim 15, wherein the first state is a 0 and the second state is a 1.

17. The method of claim 15, wherein the first state is a 1 and the second state is a 0.

* * * * *